(12) United States Patent
Ham (10) Patent No.: US 9,500,694 B2
(45) Date of Patent: Nov. 22, 2016

(54) METHOD FOR EVALUATING WAFER DEFECTS

(75) Inventor: Ho-Chan Ham, Gwangmyeong-si (KR)

(73) Assignee: LG Siltron Inc., Gyeongsangbuk-do (KR)

( * ) Notice: Subject to any disclaimer, the term of this patent is extended or adjusted under 35 U.S.C. 154(b) by 324 days.

(21) Appl. No.: 14/129,026

(22) PCT Filed: Jul. 3, 2012

(86) PCT No.: PCT/KR2012/005287
§ 371 (c)(1),
(2), (4) Date: Dec. 23, 2013

(87) PCT Pub. No.: WO2013/009026
PCT Pub. Date: Jan. 17, 2013

(65) Prior Publication Data
US 2014/0125374 A1    May 8, 2014

(30) Foreign Application Priority Data
Jul. 8, 2011    (KR) .................. 10-2011-0067746

(51) Int. Cl.
C30B 33/04    (2006.01)
G01R 31/12    (2006.01)
C30B 29/06    (2006.01)
H01L 21/66    (2006.01)
G01R 31/26    (2014.01)

(52) U.S. Cl.
CPC .......... G01R 31/1218 (2013.01); C30B 29/06 (2013.01); C30B 33/04 (2013.01); G01R 31/2648 (2013.01); H01L 22/12 (2013.01); H01L 22/14 (2013.01)

(58) Field of Classification Search
CPC .............................. C30B 29/06; C30B 33/04
See application file for complete search history.

(56) References Cited

U.S. PATENT DOCUMENTS

| | | | | |
|---|---|---|---|---|
| 5,708,365 | A | * | 1/1998 | Yoshino ................. H01L 22/14 257/E21.531 |
| 7,727,783 | B2 | * | 6/2010 | Kubota ................. H01L 22/14 257/E21.531 |
| 2007/0287205 | A1 | | 12/2007 | Kubota |

FOREIGN PATENT DOCUMENTS

| | | |
|---|---|---|
| JP | 08-083828 A | 3/1996 |
| JP | 11-297779 A | 10/1999 |
| JP | 2004-087591 | 3/2004 |
| JP | 2004-235592 | 8/2004 |
| JP | 2007-088421 | 4/2007 |
| JP | 2007-281331 | 10/2007 |
| JP | 2010-161384 | 7/2010 |
| KR | 10-2002-0051346 A | 6/2002 |

OTHER PUBLICATIONS

Japanese Patent Application No. 2014-520114 Reasons for Rejection mailed Jan. 20, 2015 (No. English Translation provided).
PCT/KR2012/005287 Search Report dated Jan. 10, 2013.

* cited by examiner

Primary Examiner — Robert M Kunemund
(74) Attorney, Agent, or Firm — Lewis Roca Rothgerber Christie LLP (57) ABSTRACT

Provided is a method for evaluating defects in a wafer. The method for evaluating the wafer defects includes preparing a wafer sample, forming an oxidation layer on the wafer sample, measuring a diffusion distance of a minority carrier using a surface photovoltage (SPV), and determining results of a contamination degree.

7 Claims, 11 Drawing Sheets

METHOD FOR EVALUATING WAFER DEFECTS

CROSS-REFERENCE TO RELATED APPLICATIONS

The present application is a national phase application of PCT application PCT/KR2012/005287 filed Jul. 3, 2012, which claims the priority benefit of Korean patent application 10-2011-0067746 filed Jul. 8, 2011, the disclosures of which are incorporated herein by reference.

TECHNICAL FIELD

Embodiments relates to a method for evaluating defects in wafer.

BACKGROUND ART

In general, a CZochralski (hereinafter, referred to as a "CZ") method is most widely used as a method for manufacturing silicon wafers. In the CZ method, polycrystalline silicon is charged into a quartz crucible, and the charged polycrystalline silicon is heated and molten by graphite heater. Then, a seed crystal is immersed into the resultant molten silicon to cause crystallization on an interface therebetween. Thus, a monocrystalline silicon ingot is grown by pulling up the immersed seed crystal while rotating the seed crystal. Then, the grown silicon ingot is sliced, etched, and polished to manufacture a silicon wafer.

The monocrystalline silicon ingot or silicon wafer manufactured through the above-described processes may have crystal defects such as crystal originated particles (COPs), flow pattern defects (FPDs), oxygen induced stacking faults (OISFs), and bulk micro defects (BMDs), which are called grown-in defects. There is a need for reducing the density and size of the grown-in defects. There has been confirmed that the crystal defects affect the yield and quality of devices. Thus, it is very important to completely remove the crystal defects and to easily and quickly evaluate the crystal defects.

Also, according to the crystal growth conditions, the monocrystalline silicon ingot or silicon wafer includes a V-rich zone in which vacancy-type point defects are prevalent to cause supersaturated vacancy cluster (condensed) detects, a Pv zone in which vacancy-type point defects are prevalent, but no cluster defects exist, a vacancy/interstitial (V/I) boundary, a Pi zone in which interstitial point defects are prevalent, but no cluster defects exist, an I-rich zone in which interstitial point defects are prevalent to cause supersaturated interstitial cluster defects.

Also, it is important in evaluation of the quality level of the crystal to confirm how the above zones are changed depending on their occurrence positions and crystal lengths of the monocrystalline silicon ingot.

According to the related art, in the monocrystalline silicon ingot manufactured using the CZ method, if the monocrystalline silicon ingot is grown (fast growth) above a V/G critical value according to a boron-copper theory that is called a V/G, a V-rich having void defects occurs. Also, if the monocrystalline silicon ingot is grown (slow growth) below the V/G critical value, oxygen induced stacking faults (OISFs) occur in an edge or center zone into a ring shape. If the monocrystalline silicon ingot is more slowly grown, a dislocation loop in which interstitial silicon is gathered is tangled to cause an I-rich that is a loop dominant point (LDP) defect zone.

A perfection zone, but not a V-rich or an I-rich, exists on a boundary between a V zone and an I zone. The perfection zone may be classified into a Pv zone that is a vacancy dominant point (VDP) perfection zone and a Pi zone that is an interstitial dominant point (IDP) perfection zone. To manufacturing perfection wafers, the above zones may be recognized as a manufacturing margin.

Methods for evaluating a silicon wafer according to the related art are as follows.

First, there is a method for evaluating silicon wafer surface defects which performs an RTP processing on a wafer where a COP defect having a size less than about 65 nm exists to calculate a diffusion distance of a minority carrier on the wafer using a surface photovoltage (SPV) method. Here, a COP serves as a recombination center of the minority carrier. Thus, the COP which is not detected by a particle counter may be detected.

However, in case of the SPV method using the RTP processing, even though a crystal defect having a size of about 65 nm or less can be detected, an existing particle counter may detect only a crystal defect and distribution having a size of about 50 nm or less or a size of about 20 nm to about 30 nm. Thus, a more precise measurement method is required.

Second, there is a method which detects a zone, which has improved time zero dielectric breakdown (TZDB) properties and is not included in a V-rich zone, an OISF zone, and a zone which is detected by a Cu decoration method, a reactive ion etching (RIE) method. When RIE defects are not detected through the RIE method, the RIE method may be a method for confirming a high quality silicon wafer where oxidation layer breakdown properties are not degraded even though a device is manufactured.

Although the RIE method is advantageous for detecting a TZDB degradation zone, equipment for performing a separate ion etching process should be provided. In addition, separate equipment for confirming a wafer (that is an actual product) in which the RIE process is performed should be provided.

Third, there is a method which can confirm the crystal degradation zone, which is not confirmed through the second method, by improving the TZDB method. Although the existing TXDB method may be improved to confirm the RIE zone, additional thermal process and annealing processes may be required. Thus, it takes a long time to perform the above-described method, and also, sample manufacturing fail possibility may exist when a sample for measuring the TZDB is manufactured.

Fourth, in a method for classifying crystal defect zones of the monocrystalline silicon and a Cu contamination solution for evaluating the crystal defect zones, one side surface of the wafer may be contaminated using the Cu solution having a predetermined concentration, and then the wafer may be thermally processed at a specific temperature and for a predetermined time to visually observe a Cu haze occurring in a specific zone, thereby classifying the crystal defect zones.

Although the Cu haze evaluation method has an advantage in which the Cu haze evaluation method can confirm other crystal defect zones in addition to the TZDB degradation zone, an accurate Cu concentration level should be maintained. In addition, separate two thermal processing processes should be performed for confirming an accurate crystal zone, for example, the TZDB degradation zone or the RIE detection zone.

SUMMARY OF THE PRESENTLY CLAIMED INVENTION

Technical Problem

Embodiments provide a method for evaluating defects in a wafer which can evaluate the wafer defects on an zone in which a time zero dielectric breakdown properties are not degraded, using a surface photovoltage (SPV) method.

Embodiments also provide a method for evaluating defects in a wafer in which crystal zones can be classified into an LDP zone, a pure zone, a Pv zone, and a Pi zone.

Technical Solution

In one embodiment, a silicon wafer includes a silicon wafer manufactured by using a CZochralski method, wherein an oxidation layer having a predetermined thickness is deposited on the silicon wafer to measure a diffusion distance of a minority carrier of the wafer using a surface photovoltage (SPV) method.

In another embodiment, a method for evaluating defects in a wafer includes: preparing a wafer sample; forming an oxidation layer on the wafer sample; measuring a diffusion distance of a minority carrier using a surface photovoltage (SPV); and determining results of a contamination degree.

Advantageous Effects

The method for evaluating the wafer defects according to the embodiment may provide a method which can simply evaluate wafer detects after crystal zones are classified, particularly, diffusion distances of minority carriers within a wafer are measured on existing V-rich and OISF zones and a zone, in which the wafer defects are not detected using a Cu decoration method while being not degraded in TZDB property, using a SPV method.

Also, according to the current embodiment, whether the wafer or ingot is contaminated may be simply confirmed within a short time. Furthermore, it may be applied by anyone because a reference required for classifying the silicon defect zones is clear.

As described above, the current embodiment utilizes the SPV method. Thus, when compared with an existing method in view of the confirmation of the results, the current embodiment may provide an objective method for evaluating wafer defects because preprocessing processes performed before the SPV measurement can be performed as objective processes without depending on a user's skill.

Also, the embodiments may provide the method for evaluating the wafer defects in which the crystal zones can be classified into the LDP defect zone, the pure zone, the Pv zone, and the Pi zone.

DETAILED DESCRIPTION

Exemplary embodiments provide a method for evaluating wafer defects, which can evaluate the wafer defects on a zone in which a time zero dielectric breakdown properties are not degraded, using a surface photovoltage (SPV) method.

Figure 1:
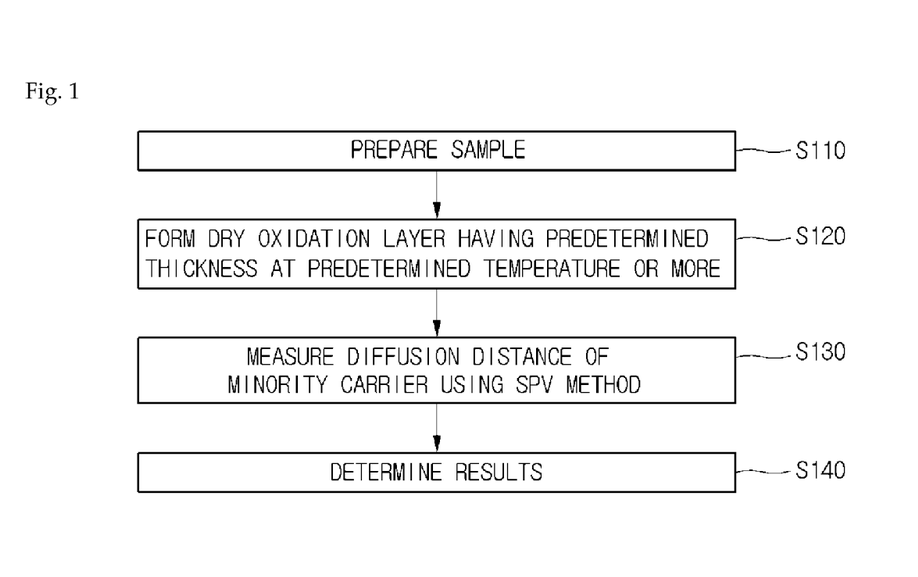
FIG. 1 is a flowchart illustrating a method for evaluating wafer detects according to an embodiment.

FIG. 1 is a flowchart illustrating a method for evaluating wafer detects according to an embodiment.

The method for evaluating wafer defects according to an embodiment may include preparing a wafer sample (S110), forming an oxidation layer on the wafer sample (S120), measuring diffusion distances of minority carriers using a surface photovoltage method (S130), and determining a degree of contamination (S140).

The method for evaluating the wafer defects according to the embodiment may provide a method which may simply evaluate wafer detects after crystal zones are classified, particularly, diffusion distances of minority carriers within a wafer are measured on existing V-rich and OISF zones and a zone, in which the wafer defects are not detected using a Cu decoration method while being not degraded in TZDB property, using a SPV method.

Particularly, the method for evaluating the wafer defects according to the embodiment may provide a method for evaluating silicon wafer point defects which may classify Pv and Pi zones that are perfection zones in which silicon point cluster defects do not exist in addition to the detection of the zones which are not degraded in time zero dielectric breakdown (TZDB) property and time dependent dielectric breakdown (TDDB) property.

Also, according to the current embodiment, whether the wafer or ingot is contaminated may be simply confirmed within a short time. Furthermore, it may be applied by anyone because a reference required for classifying the silicon defect zones is clear.

As described above, the current embodiment utilizes the SPV method. Thus, when compared with an existing method in view of the confirmation of the results, the current embodiment may provide an objective method for evaluating wafer defects because preprocessing processes performed before the SPV measurement can be performed as objective processes without depending on a user's skill.

Hereinafter, the method for evaluating the wafer defects according to the current embodiment will be described in detail with reference to the accompanying drawings.

First, in the method for evaluating the wafer defects according to the current embodiment, an evaluation sample is prepared in operation S110. Then, in operation S120, a dry oxidation layer having a predetermined thickness at a predetermined temperature or more is formed.

The thickness and temperature of the oxidation layer may vary according to an oxygen concentration of the wafer, a crystal defect distribution of the wafer, and the like. That is, since the diffusion distances of the minority carrier may be changed according to the above-described conditions, the evaluation reference may vary.

The oxidation layer may be a dry oxidation layer or a wet oxidation layer. The oxidation layer may have a thickness of about 100 Å to several ten thousands Å. For example, the oxidation layer may have a thickness of about 100 Å to about 12,000 Å. When the oxidation layer has a thickness of about 100 Å or less, the minority carriers may not be detected. On the other hand, when the oxidation layer has a thickness of about 12,000 Å or more, the minority carriers may be excessively diffused.

For example, in the current embodiment, an oxidation layer formation process may be performed at a temperature of about 900° C. to about 1,000° C. for a time of about 60 minutes to about 140 minutes to form a dry oxidation layer having a thickness of about 100 Å to about 1,000 Å, but is not limited thereto.

According to the current embodiment, defects with respect to the entire crystal zones of the wafer may be detected through the formation of the oxidation layer.

Next, in operation S130, the diffusion distances of the minority carrier of the wafer on which an oxidation layer having a predetermined thickness is deposited by a dry process are measured using the SPV method.

Here, when the diffusion distances of the minority carrier are measured using the SPV method, light emitted onto the wafer may have a wavelength of about 450 nm to about 1,200 nm. According to the current embodiment, like that a bulk Fe concentration is measured using the SPV method, separate preprocessing processes are not required. When a wavelength of light exceeds the foregoing wavelength range, the wavelength may get out of the wafer having a thickness of about 1 μm.

Although the SPV measurement conditions may vary according to the conditions and size of the sample, the SPV may be measured under the same reference. In operation S140, a degree of contamination may be determined by classifying zones on the basis of diffusion distances on a zone in which the crystal defects may exist.

According to the current embodiment, the preprocessing processes performed before the SPV measurement may be performed as objective processes to provide a method for objectively evaluating wafer defects.

Also, according to the current embodiment, whether the wafer or ingot is contaminated may be simply confirmed within a short time. Furthermore, it may be applied by anyone because a reference required for classifying the silicon defect zones is clear.

Also, the method for evaluating the wafer defects according to the embodiment may provide a method which can simply evaluate wafer detects after crystal zones are classified, particularly, diffusion distances of minority carriers within a wafer are measured on existing V-rich and OISF zones and a zone, in which the wafer defects are not detected using a Cu decoration method while being not degraded in TZDB property, using a SPV method.

Particularly, the method for evaluating the wafer defects according to the embodiment may provide a method for evaluating silicon wafer point defects which may classify Pv and Pi zones that are perfection zones in which silicon point cluster defects do not exist in addition to the detection of the zones which are not degraded in time zero dielectric breakdown (TZDB) property and time dependent dielectric breakdown (TDDB) property.

FIGS. 2 to 5 are views illustrating comparison examples of an evaluation result obtained using a method for evaluating silicon wafer point detects.

Embodiments

Figure 2:
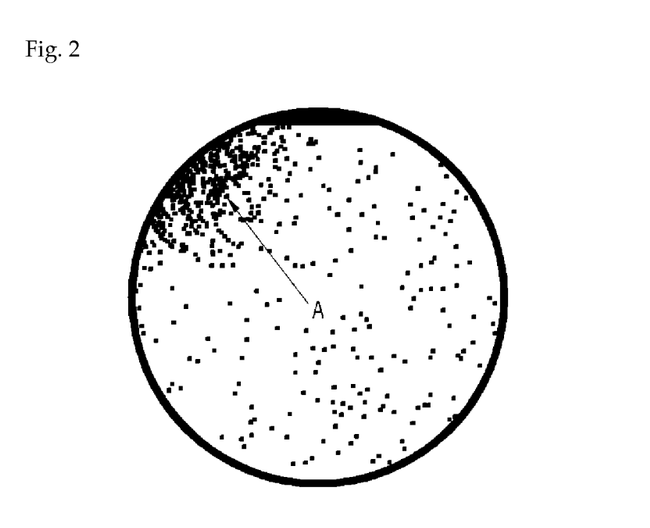
FIGS. 2 to 4 are views illustrating comparison examples of an evaluation result obtained using a method for evaluating silicon wafer point detects.
Figure 3:
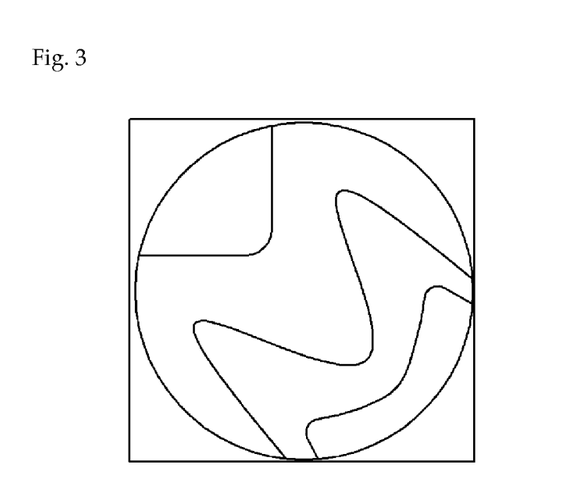
Figure 4:
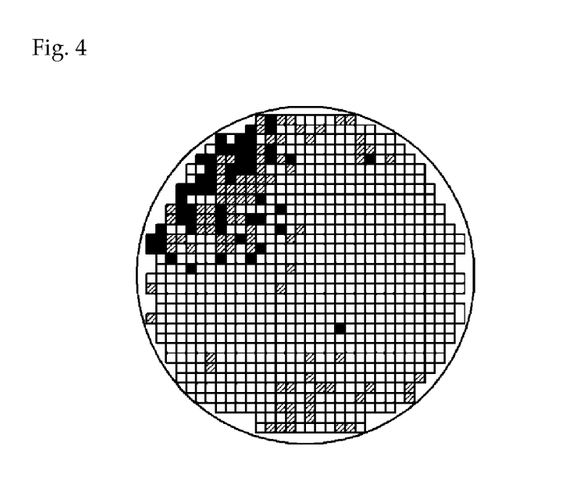

FIGS. 2 to 4 illustrate results obtained by the evaluation method using a V-test sample including a V-rich zone and a perfection zone in which silicon point cluster defects do not exist, for example, a Pv zone (a vacancy dominant point (VDP) defect zone) and a Pi zone (an interstitial dominant point (IDP) defect zone) through the foregoing methods according to the related art.

A method for detecting a COP after the RTP according to the related art is applied is not performed.

As shown in FIG. 2, according to results of a sample evaluated by using MAGCIS equipment which can measure crystal defects having a crystal originated particle (COP) size of about 50 nm or less or a small void shape, it may be seen that COP defects having fine sizes exist on a left upper end A.

Next, as shown in FIG. 3, according to evaluation results obtained by using a Cu haze method, it may be seen that the Pv zone (the VDP defect zone) and the Pi zone (the IDP defect zone) which are called perfection zones are completely classified.

According to a first TZDB evaluation results (see FIG. 4) on the basis of the above-described results, it may be seen that a TZDB fail with respect to a B mode exists only in the existing COP zone.

However, when a method for detecting a zone in which the TZDB is degraded, i.e., a zone in which a GOI fail does not exist in a method for confirming a high quality silicon wafer where oxidation layer breakdown properties are not degraded even though a device is manufactured is applied, it may be seen that a C&C+ mode fail exists in a TZDB degradation zone in which the wafer defects are not detected through the existing methods (see FIG. 4, a second TZDB map). Particularly, when an RIE method is applied to the above-described zones, it may be seen that RIE defects exist in the same zone.

Embodiment 1

Figure 5:
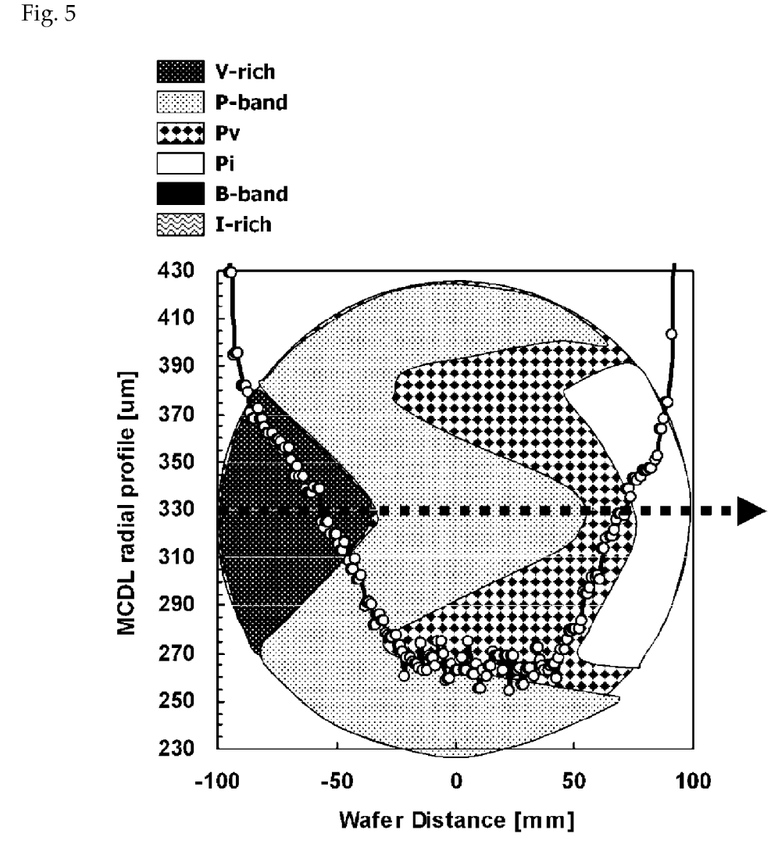
FIGS. 5 and 6 are graphs illustrating examples of diffusion distances of minority carriers for each crystal zone in a sample observed through a method for classifying silicon defect zones using the method for evaluating the silicon wafer point defects.
Figure 6:
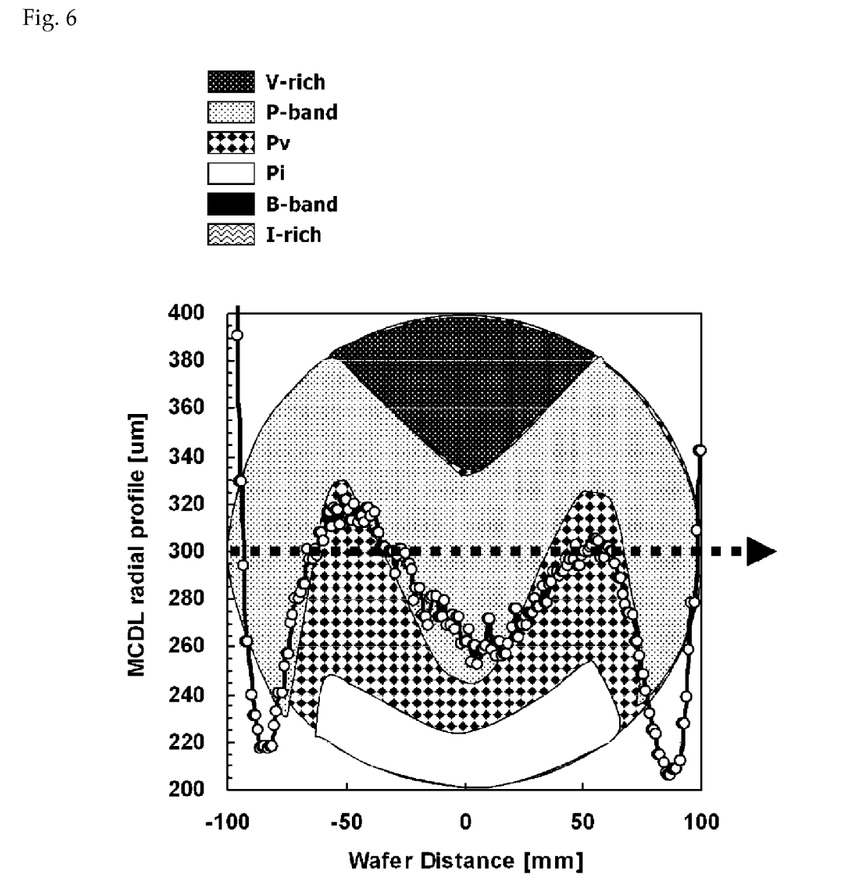

FIGS. 5 and 6 are graphs illustrating examples of diffusion distances of minority carriers for each crystal zone in a sample observed through a method for classifying silicon defect zones using the method for evaluating the silicon wafer point defects.

After the oxidation layer is formed to perform the current embodiment under the same sample, it may be seen that the zones are independently classified into the same zone as those of the existing methods in the evaluation results (a MCDL map) using the SPV method.

According to the results, although the evaluation results are obtained using the V-test in which an loop dominant point (LDP) defect zone is not included, it may be seen that the zones may be classified on the V-test including an interstitial rich zone in which the LDP defects are detected.

In case of FIG. 5, when the diffusion distances of the minority carriers have a profile shape from the V-rich to the Pi zone (IDP zone), the lowest value exists at a middle portion.

In case of FIG. 6, according to results to which a novel embodiment is applied, it may be seen that the TZDB degradation zone and the Pv zone (VDP zone) may be classified even in a zone in which the TZDB degradation zone and the Pv zone (VDP zone) are mixed.

When based on the zone having the lowest value in the diffusion distances of the minority carriers, a diffusion distance of about 270 μm or less occurs in the degradation zone. This reference may be numerically quantified in addition to the confirmation using a next map. Of cause, when a sample including the LDP defect zone is used, the reference may be changed.

Also, in case of evaluation using a general polished wafer except for a sample including the various crystal zones, the zones may be confirmed and additionally classified through the same method as the above-described methods.

Figure 7:
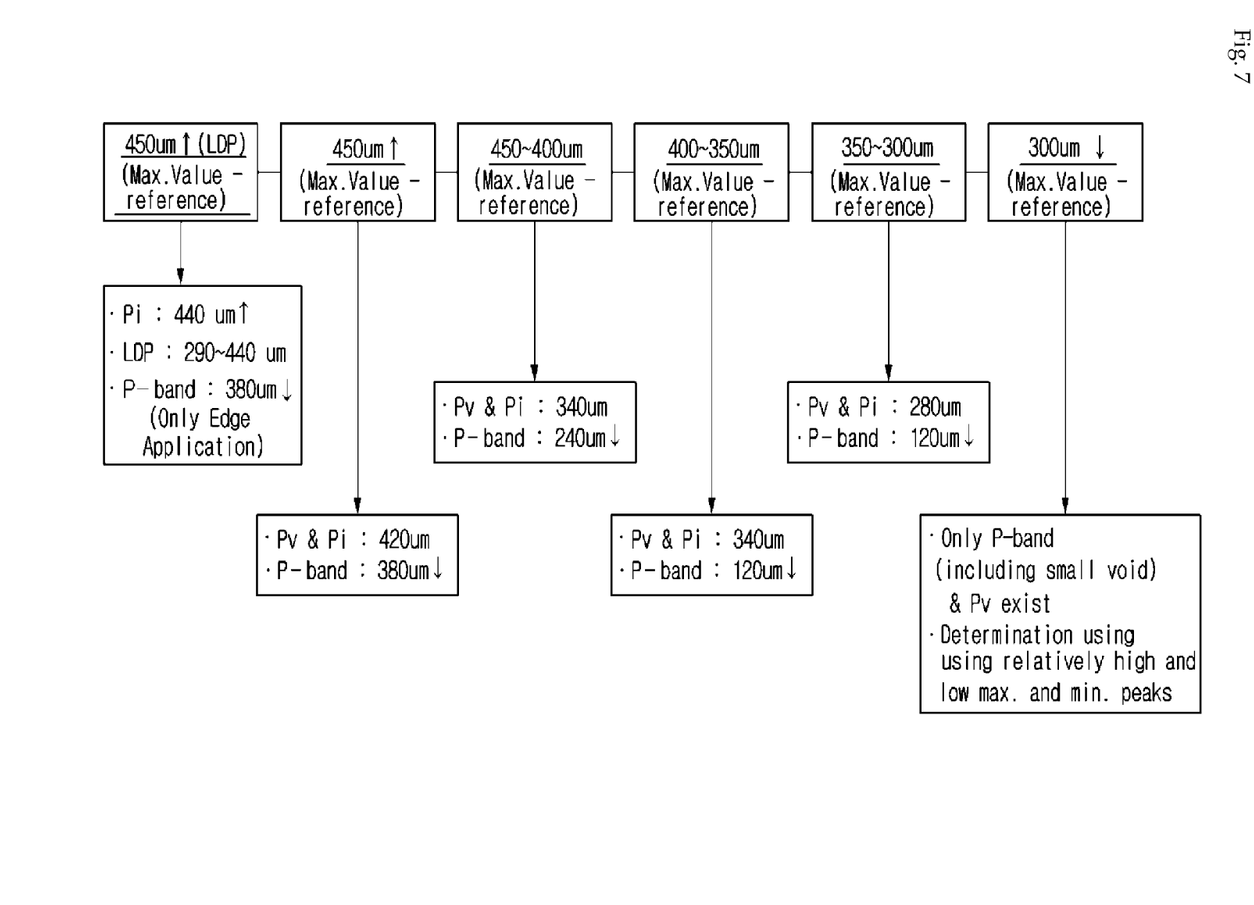
FIG. 7 is a view illustrating a specific example of a method for evaluating the silicon wafer point defects using a normal polished wafer according to an embodiment.

FIG. 7 is a view illustrating a specific example of a method for evaluating the silicon wafer point defects using a normal polished wafer according to an embodiment.

FIGS. 8 to 13 are views illustrating examples of diffusion distances of minority carrier using a SPV method, a map classifying crystal zones using a Cu haze, and examples of diffusion distances of minority carriers in a horizontal direction in a state where the crystal zones classified by using the Cu haze according to an embodiment. In FIGS. 8 to 14, a P-band is illustrated as the same meaning as an O-band.

Figure 8:
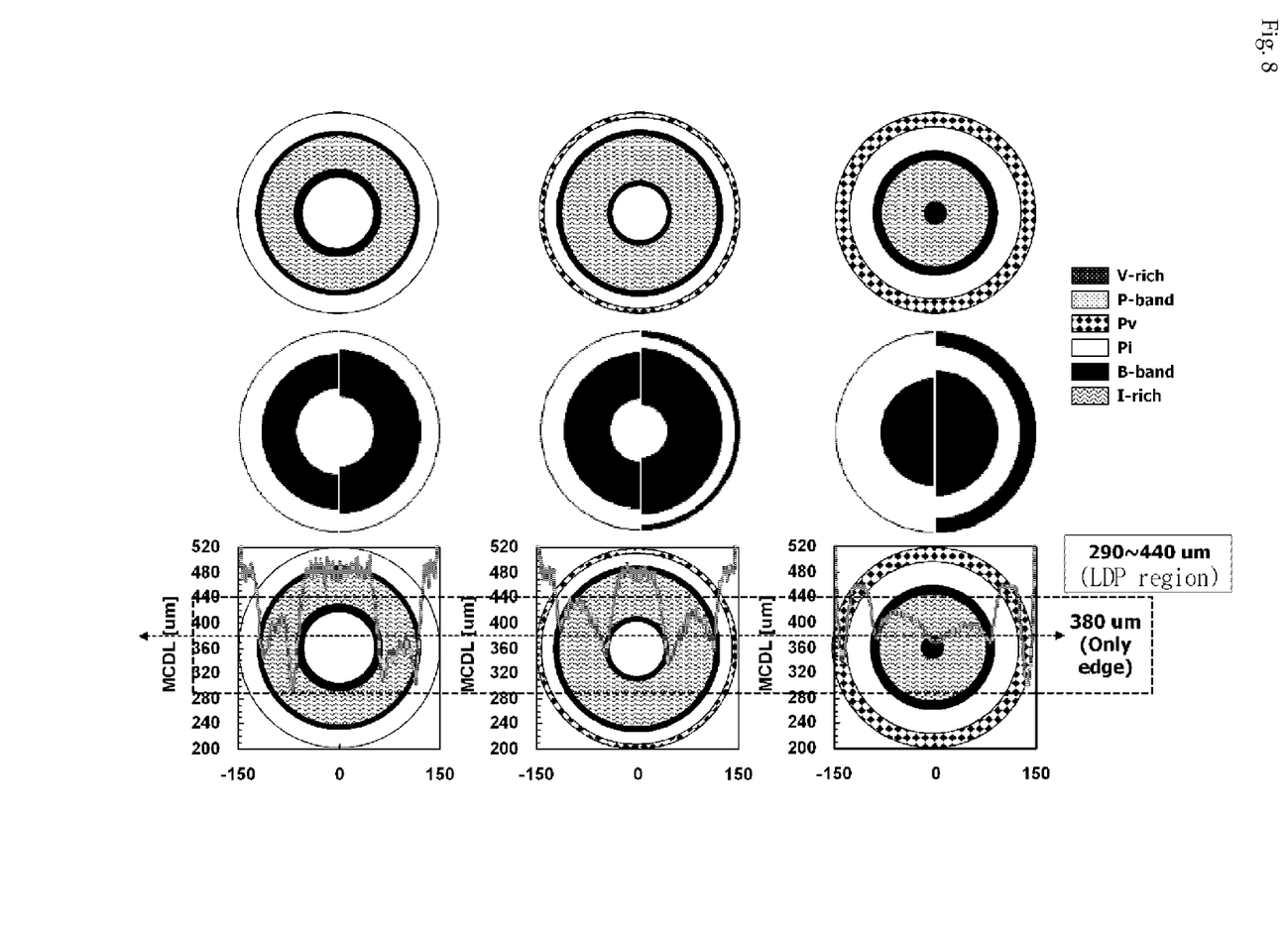
FIGS. 8 to 13 are views illustrating examples of diffusion distances of minority carrier using a SPV method, a map classifying crystal zones using a Cu haze, and examples of diffusion distances of minority carriers in a horizontal direction in a state where the crystal zones classified by using the Cu haze according to an embodiment.

FIG. 8 illustrates results obtained using a sample in which the minority carriers have a diffusion distance of about 450 μm or more in a case where a loop dominant point (LDP) defect zone is included. That is, the uppermost results illustrate examples of diffusion distance results of the minority carriers using an SPV method according to an embodiment. The middle results illustrate maps in which crystal zones are classified using a Cu haze. The lowermost results illustrate examples of diffusion distance results of the minority carriers in a horizontal direction in a state where the crystal zones are schematically classified using the Cu haze.

In case of LDP defects, unlike a V-rich, since the LDP defects exist in an I-rich zone in which interstitial point defects are prevalent, the most of LDP defects exist in a zone adjacent to a Pi zone. Also, except for a case in which the LDP defects exist in a front surface, the LDP defects exist almost in a tube or circle type on a center zone including the B-band zone.

Figure 12:
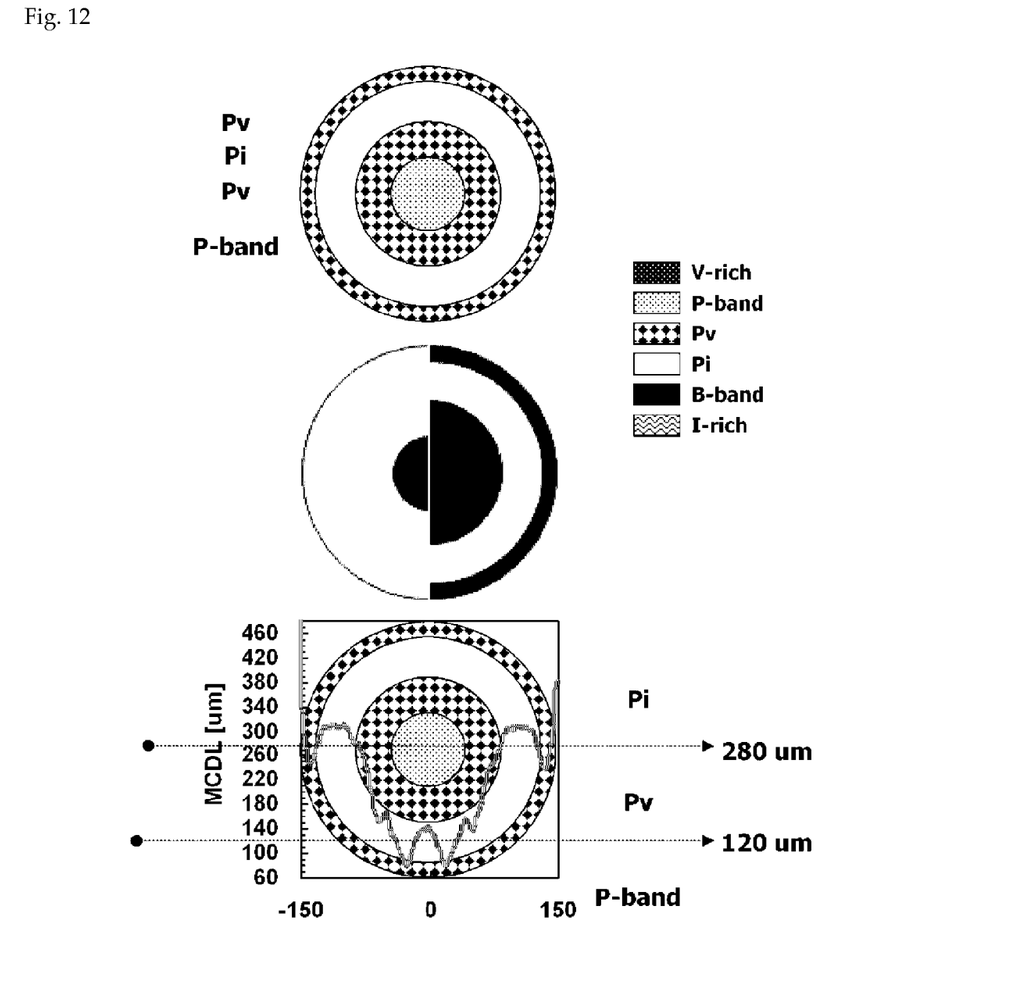

In a case of a sample having the LDP defects as shown in FIG. 8, it is observed that a minority carrier diff. length is about 450 μm or more. In a case of a sample (MCDL_Pure 450 μm or more) in which the LDP defects do not exist as shown in FIG. 12, the crystal zone may not exist in the tube or circle type on the center zone.

In FIG. 8, the Pi zone may have a size of about 440 μm or more, and the LDP defect zone may have a size of about 290 μm to about 440 μm, but are not limited thereto.

According to the current embodiment, a Pv zone may occur in an edge portion of the crystal zone. In this case, an MCDL value may be about 380 μm or less. Here, a reference in the MCDL value is about 380 μm may be limitedly applied to only the edge portion.

Figure 9:
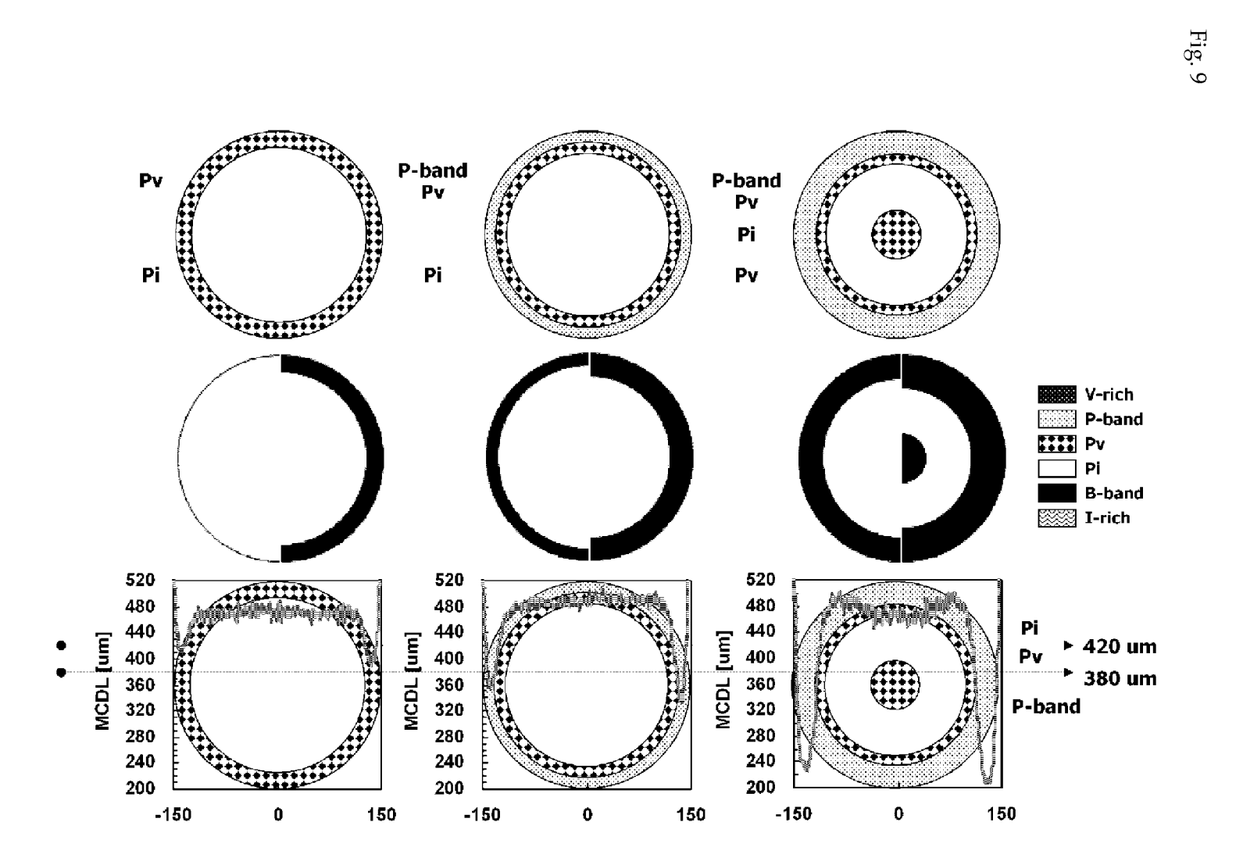

FIG. 9 illustrates results obtained using a sample in which the minority carriers have a diffusion distance of about 450 μm or more in a case (pure) where a loop dominant point (LDP) defect zone is not included. That is, the uppermost results illustrate examples of diffusion distance results of the minority carriers using the SPV method according to an embodiment. The middle results illustrate maps in which crystal zones are classified using a Cu haze. The lowermost results illustrate examples of diffusion distance results of the minority carriers in a horizontal direction in a state where the crystal zones are schematically classified using the Cu haze.

According to the current embodiment, as shown in FIG. 9, when the minority carriers have a diffusion distance of about 450 μm or more in a state where the LDP defect zone is not included, the Pi and Pv zones may be set to have a size of about 420 μm, and the P-band (O-band) zone may be set to have a size of about 380 μm or less.

In a case of a sample (MCDL_Pure 450 μm or more) in which the LDP defects do not exist as shown in FIG. 9, the crystal zone may not exist in the tube or circle type on the center zone.

In a case where an MCDL value is about 450 μm or more as shown in FIG. 9, it may be determined as a zone in which the Pi and Pv zones are prevalent. Also, the P-band zone may be detected only on the edge portion. Thus, in this case, when a MCDL profile in a radial direction (wafer reference: −150 mm~+150 mm) is confirmed, −R/2~+R/2 points of the wafer may be flat. Also, in a case where the P-band is included in the edge portion, it may be seen that an MCDL deflection phenomenon of the edge portion is more noticeable.

Figure 10:
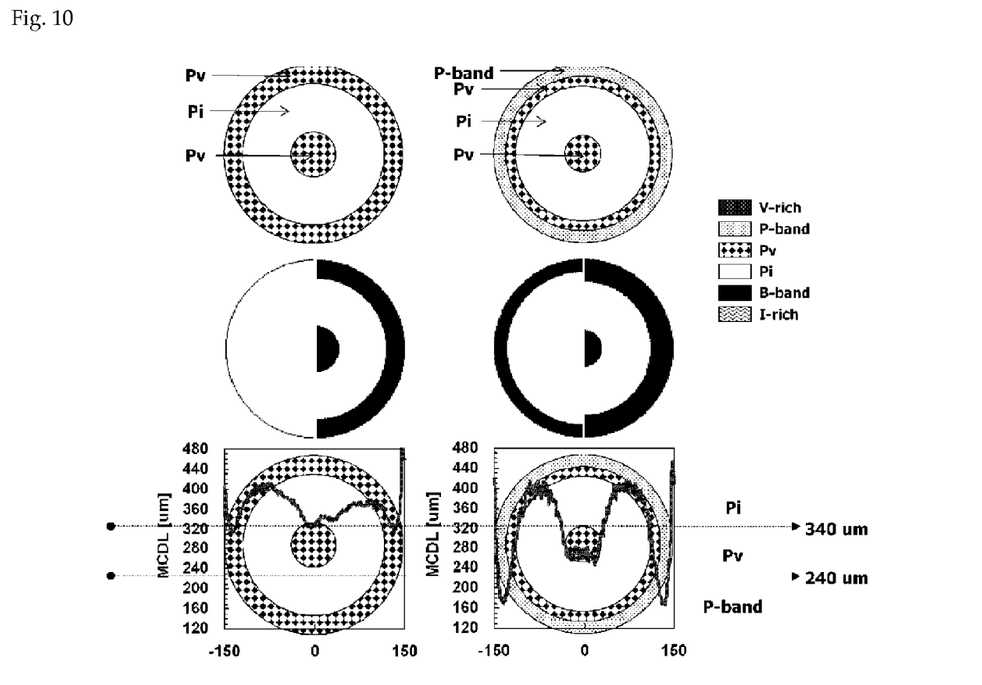

FIG. 10 illustrates results obtained using a sample in which the minority carriers have a diffusion distance of about 450 μm to about 400 μm. That is, the uppermost results illustrate examples of diffusion distance results of the minority carriers using the SPV method. The middle results illustrate maps in which crystal zones are classified using a Cu haze. The lowermost results illustrate examples of diffusion distance results of the minority carriers in a horizontal direction in a state where the crystal zones are schematically classified using the Cu haze.

According to the current embodiment, as shown in FIG. 10, when the minority carriers have a diffusion distance of about 450 μm or about 400 μm, the Pi and Pv zones may be set to have a size of about 340 μm, and the P-band (O-band) zone may be set to have a size of about 240 μm or less.

Figure 11:
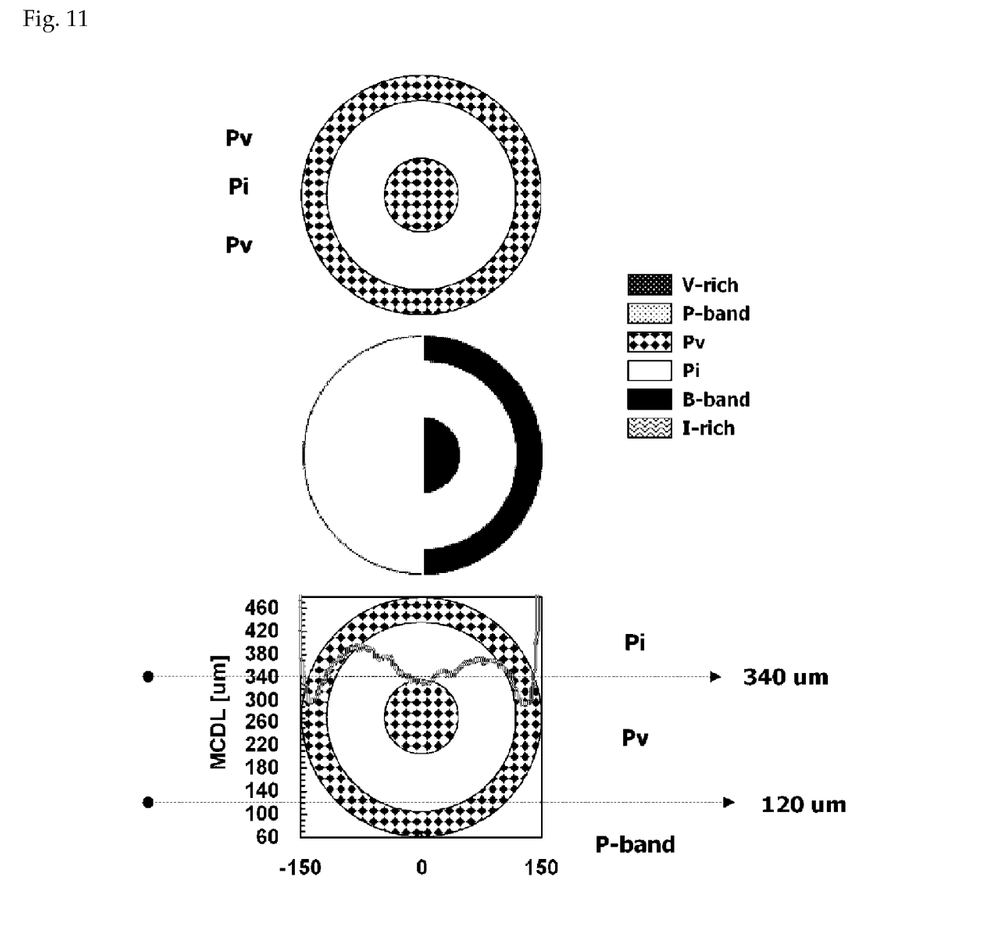

FIG. 11 illustrates results obtained using a sample in which the minority carriers have a diffusion distance of about 450 μm to about 350 μm. That is, the uppermost results illustrate examples of diffusion distance results of the minority carriers using the SPV method. The middle results illustrate maps in which crystal zones are classified using a Cu haze. The lowermost results illustrate examples of diffusion distance results of the minority carriers in a horizontal direction in a state where the crystal zones are schematically classified using the Cu haze.

According to the current embodiment, as shown in FIG. 11, when the minority carriers have a diffusion distance of about 450 μm or about 350 μm, the Pi and Pv zones may be set to have a size of about 340 μm, and the P-band (O-band) zone may be set to have a size of about 120 μm or less.

FIG. 12 illustrates results obtained using a sample in which the minority carriers have a diffusion distance of about 350 μm to about 300 μm. That is, the uppermost results illustrate examples of diffusion distance results of the minority carriers using the SPV method. The middle results illustrate maps in which crystal zones are classified using a Cu haze. The lowermost results illustrate examples of diffusion distance results of the minority carriers in a horizontal direction in a state where the crystal zones are schematically classified using the Cu haze.

According to the current embodiment, as shown in FIG. 12, when the minority carriers have a diffusion distance of about 350 μm or about 300 μm, the Pi and Pv zones may be set to have a size of about 280 μm, and the P-band (O-band) zone may be set to have a size of about 120 μm or less.

Figure 13:
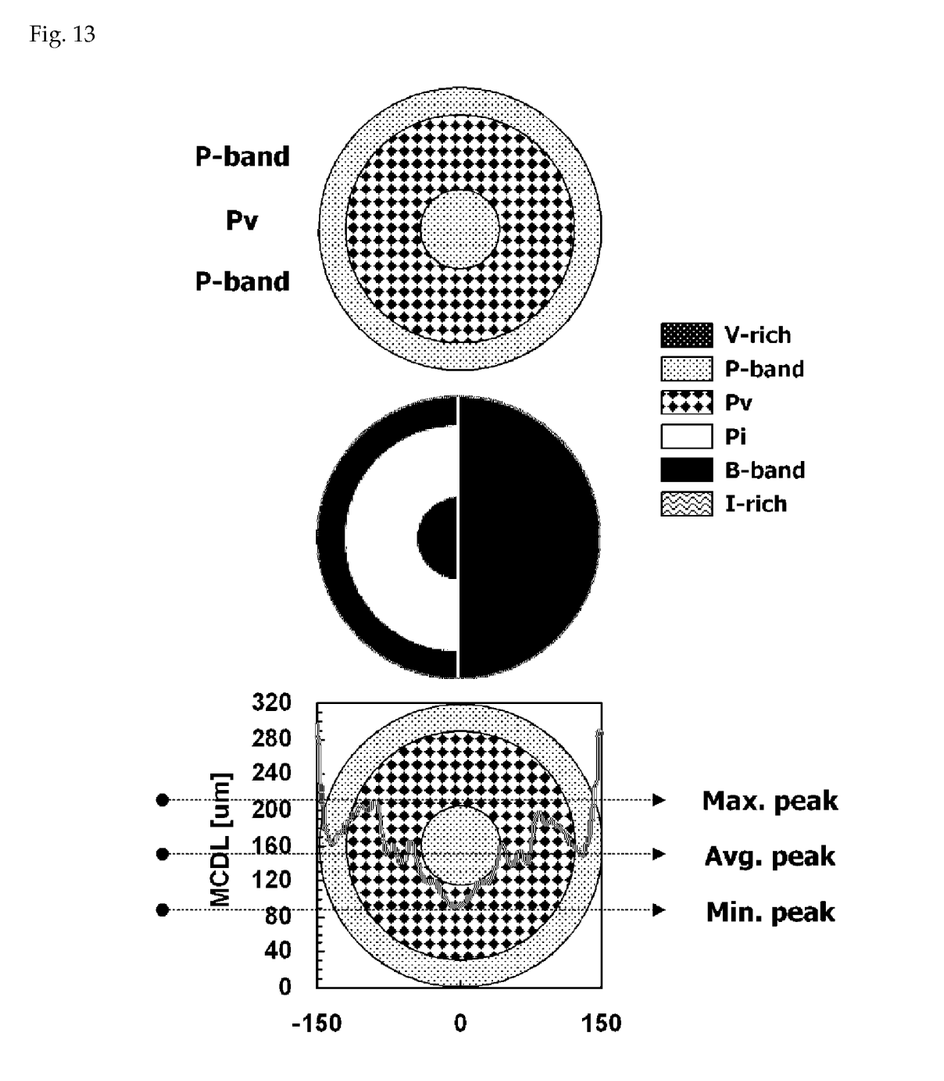

FIG. 13 illustrates results obtained using a sample in which the minority carriers have a diffusion distance of about 300 μm or less. That is, the uppermost results illustrate examples of diffusion distance results of the minority carriers using the SPV method. The middle results illustrate maps in which crystal zones are classified using a Cu haze. The lowermost results illustrate examples of diffusion distance results of the minority carriers in a horizontal direction in a state where the crystal zones are schematically classified using the Cu haze.

Referring to FIG. 13, when the minority carriers have a diffusion distance of about 300 µm or less, only the P-band (including the small void) and the Pv zone exist. Also, the MCDL value may be obtained using relatively high and low maximum and minimum peaks.

The method for evaluating the wafer defects according to the embodiment may provide a method which can simply evaluate wafer detects after crystal zones are classified, particularly, diffusion distances of minority carriers within a wafer are measured on existing V-rich and OISF zones and a zone, in which the wafer defects are not detected using a Cu decoration method while being not degraded in TZDB property, using a SPV method.

Also, according to the current embodiment, whether the wafer or ingot is contaminated may be simply confirmed within a short time. Furthermore, it may be applied by anyone because a reference required for classifying the silicon defect zones is clear.

As described above, the current embodiment utilizes the SPV method. Thus, when compared with an existing method in view of the confirmation of the results, the current embodiment may provide an objective method for evaluating wafer defects because preprocessing processes performed before the SPV measurement can be performed as objective processes without depending on a user's skill.

A particular feature, structure, or effects described in connection with the embodiment is included in at least one embodiment of the invention, and is not limited to only one embodiment. Further, when a particular feature, structure, or characteristic is described in connection with any embodiment, it is submitted that it is within the purview of one skilled in the art to effect such feature, structure, or characteristic in connection with other ones of the embodiments. Therefore, contents with respect to various variations and modifications will be construed as being included in the scope of the present disclosure.

INDUSTRIAL APPLICABILITY

Since the current embodiment can detect the wafer defects, industrial applicability may be significantly high.

The invention claimed is:

1. A method for evaluating defects in a wafer, the method comprising:
preparing a wafer sample;
forming an oxidation layer on the wafer sample;
measuring a diffusion distance of a minority carrier using a surface photovoltage (SPV); and
identifying results of a contamination degree, wherein a Pi zone is set to have a size of about 440 µm or more and a loop dominant point (LDP) defect zone is set to have a size of about 290 µm to about 440 µm when the minority carrier has a diffusion distance of about 450 µm or more in a state where the LDP defect zone is included.

2. The method according to claim 1, wherein the oxidation layer has a thickness of about 100 Å to about 12000 Å.

3. The method according to claim 2, wherein the formation of the oxidation layer is performed at a temperature of about 900° C. to about 1,000° C. for a time of about 60 minutes to about 140 minutes.

4. The method according to claim 1, wherein, in the identifying of the results of the contamination degree, when the minority carrier has a diffusion distance of about 450 µm or more in a state where the loop dominant point (LDP) defect zone is excluded from at least one area of the wafer sample, each of the Pi zone and a Pv zone is set to have a size of about 420 µm, and an O-band zone is set to have a size of about 380 µm or less.

5. The method according to claim 1, wherein, in the identifying of the results of the contamination degree, when the minority carrier has a diffusion distance of about 450 µm to about 400 µm each of the Pi zone and a Pv zone is set to have a size of about 340 µm, and an O-band zone is set to have a size of about 240 µm or less.

6. The method according to claim 1, wherein, in the identifying of the results of the contamination degree, when the minority carrier has a diffusion distance of about 400 µm to about 350 µm, each of the Pi zone and a Pv zone is set to have a size of about 340 µm and an O-band zone is set to have a size of about 120 µm or less.

7. The method according to claim 1, wherein, in the identifying of the results of the contamination degree, when the minority carrier has a diffusion distance of about 350 µm to about 300 µm, each of Pi and Pv zones is set to have a size of about 280 µm, and a P-band (O-band) zone is set to have a size of about 120 µm or less.

* * * * *